United States Patent [19]

Posluszny et al.

[11] Patent Number: 4,545,027
[45] Date of Patent: Oct. 1, 1985

[54] DIGITAL ADAPTIVE CORRELATING FILTER

[75] Inventors: Thomas Posluszny, Juno Isles, Fla.; Oscar Oliver, Sr., Wantagh, N.Y.

[73] Assignee: United Technologies Corporation, Hartford, Conn.

[21] Appl. No.: 508,631

[22] Filed: Jun. 28, 1983

[51] Int. Cl.$^4$ ............................................. G06F 7/38
[52] U.S. Cl. .................................... 364/724; 328/138
[58] Field of Search ................ 364/724, 725; 328/138, 328/140, 167, 162, 165; 324/78 D, 78 F, 78 S; 179/84 VF

[56] References Cited

U.S. PATENT DOCUMENTS

| 4,250,453 | 2/1981 | Nilsson | 328/138 |
| 4,258,423 | 3/1981 | Lane et al. | 328/138 |
| 4,328,398 | 5/1982 | Kawaguchi et al. | 364/724 |
| 4,351,032 | 9/1982 | Challen | 364/724 |
| 4,358,737 | 11/1982 | Bennett | 328/138 |
| 4,442,500 | 4/1984 | Kongable et al. | 364/724 |

Primary Examiner—Michael R. Fleming
Attorney, Agent, or Firm—Eric W. Petraske

[57] ABSTRACT

An adaptive digital filter employs sequentially connected shift register stages to produce an N-fold correlation of pulses within a pulse train that satisfy search criteria. Once a signal has been acquired, a processor adaptively changes the tolerance length of the shift registers; the shifting clock and the number of stages to generate a real-time processed signal that tracks the source of the pulse train.

4 Claims, 3 Drawing Figures

DIGITAL ADAPTIVE CORRELATING FILTER

DESCRIPTION

1. Technical Field

The field of the invention is that of a digital filter used to recognize a pattern of pulses in the presence of noise or other signals.

2. Background Art

If a pattern to be recognized is not known precisely but only known within a certain tolerance, then conventional digital pattern recognition techniques are poorly adapted to the problem. Conventionally, the tolerance required to fit a pulse interval increases as the number of pulses to be correlated increases. Present approaches involve complicated pattern recognition techniques involving many cumulative iterations in order to increase the confidence of pattern determination. Such an approach requires a rather sophisticated computer and cannot be performed in real time.

A simple approach which works in real time employing discrete shift registers performs only a two-stage correlation with raw unsynchronized data.

DISCLOSURE OF INVENTION

The invention relates to an adaptive digital filter which employs a series of shift registers to perform a single period correlation on input data followed by a number of correlations on the filtered output. The number of correlations and the tolerance given to the time between pulses may be adaptively controlled to sharpen the discrimination as a function of time.

BEST MODE FOR CARRYING OUT THE INVENTION

It is known in the art that in order to recognize a repetitive signal among a background of noise or other signals, when that signal is not precisely known but only within a certain tolerance, it is necessary to search the train of incoming pulses in order to attempt to find a number of pairs of pulses which match the criterion and then to attempt to recognize a pattern among the pulses which satisfy this first criterion.

Unfortunately, for the particular application of recognizing a radar transmitter by its pattern of pulse emissions, conventional computer processing techniques are too slow. The time separation between radar pulses conventionally ranges from one millisecond to a tenth of a millisecond and the sophisticated pattern recognition techniques which are conventional cannot be implemented within that time. A further problem is that in conventional techniques that employ a number of consecutive pattern matches, the tolerance required for the imperfectly known signal multiplies along with the number of intervals that are used so that the tolerance accumulates and hence the probability of a false alarm increases.

One prior art system uses a hard wired technique employing a two-stage correlation among shift registers in which a pattern occurring within a certain tolerance interval is correlated with a train of subsequent raw, unsynchronized pulses. This approach represents a trade-off between the degree of filtering and hardware complexity since three or more stages of correlation would increase the hardware complexity considerably.

Figure 1:
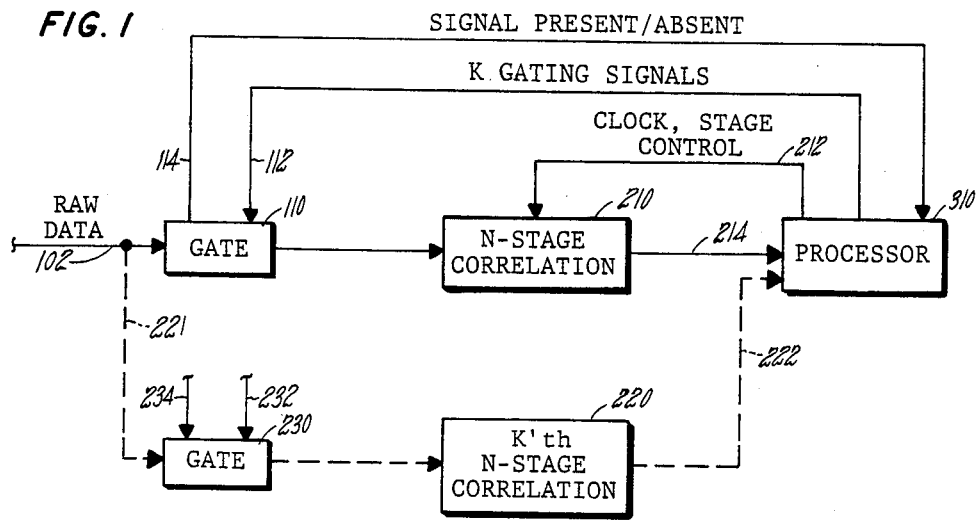
FIG. 1 illustrates schematically an adaptive filtering system employing the subject invention.

An adaptive system which accomplishes the objective of recognizing patterns quickly but does not require a trade-off between accuracy and speed is illustrated generally in FIG. 1, in which a train of input pulses from a radar detector enters along wire 102 and enters optional gate 110 which will be described in more detail below. Those pulses which are permitted to pass through gate 110 pass to an N-stage correlation filter 210 which, according to the invention, performs a match within a time interval having a tolerance which corresponds to the tolerance with which the desired signal is known and passes the output of that match through a series of consecutive correlation registers so that the output of correlation device 210 represents a train of pulses which satisfy the criterion that N consecutive pulses are spaced by the specified time interval. The degree of confidence for the output of device 210 will depend upon the tolerance which is specified and also upon the number of stages. The output of device 210 goes along wire 214 into processor 310 which controls parameters of device 210 in order to increase the degree of discrimination once a candidate signal has been identified. Processor 310 may be a digital computer together with conventional latches and other interface circuitry to control the parameters of the correlation devices.

The system is not limited to a single correlation device but may have more than one. Connector 221, shown as a dotted line in the figure, carries the pulse train of raw data through a second gate 230, similar to gate 110, and then to the K'th N-stage correlation device 220, the result of which is carried by connector 222 back to processor 310. The system may have one or more up to K devices each of which may search for a different pulse pattern.

Initially, correlation device 210 will be set with a broad tolerance in order to identify many possible candidates for the pulse train. Once such a train has been identified, processor 310 will adaptively change the tolerance criteria to sharpen the discrimination and eliminate any false alarms which may have satisfied the initial loose criteria. As will be described below, the criteria may be tightened by control of a clock signal sent to the correlation device, controlling the tolerance on the pulse rate interval, or by contolling the number of stages which are used within the correlation device. These control signals go along cable 212.

If more than one correlation device is used, it may be convenient to reduce the number of false alarms by eliminating from the K'th correlation device those signals in the raw data which have been identified as coming from a known pulse train. This is effected by sending signals along cable 114 or 234 and 112 or 232 which control an AND gate within gate 110 or 230 so that signals corresponding to a known pulse train are blocked in gate 110 or 230 and not permitted to enter the correlation device. Thus, the device only operates on pulses which are of unknown origin and the number of false alarms which pass through is thereby reduced.

Figure 2:
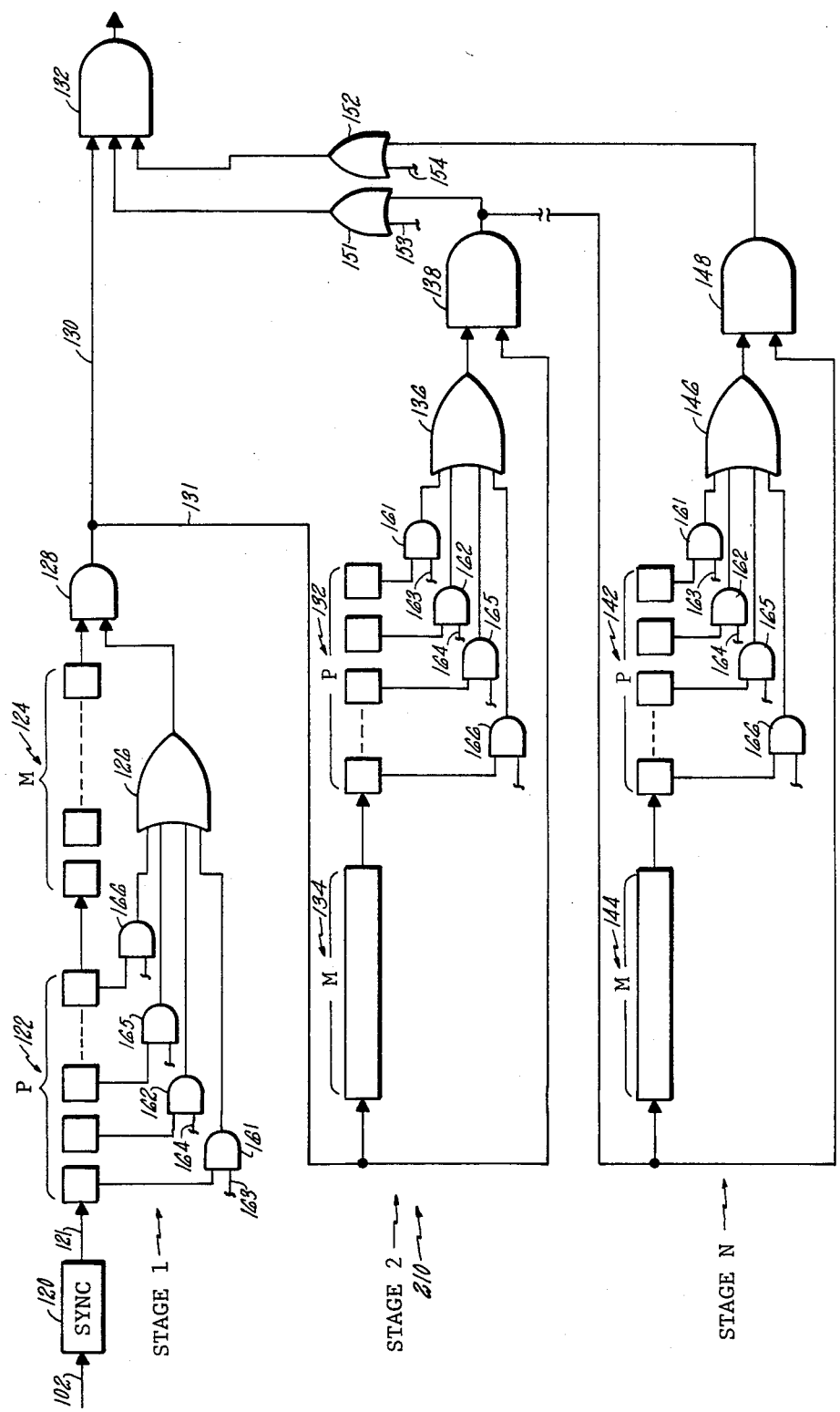
FIG. 2 illustrates schematically a correlating filter which is part of the system of FIG. 1.

FIG. 2 illustrates the operation of one of the correlation devices in which the data enters line 102 through synchronization circuit 120, which filters the raw pulses to emit a train of pulses along line 121 which are synchronized to a clock which is present throughout the correlation processor. The synchronized pulses on line 121 enter a multi-stage shift register comprising a set of P cells 122 followed by a set of M cells 124. The data is shifted through these P+M cells in accordance with the clock. The clock lines to the several cells are omitted from the drawing for simplicity. From each of the first P cells, a signal goes through an AND gate, that will be described later, to OR gate 126 and from that gate to AND gate 128 where a coincidence between the output of shift register 124 is made. Thus, the output of AND gate 128 represents a match between a pulse in the last cell of register M and a pulse within any of the P cells of register 122. This is a first stage correlation on the unfiltered synchronized data. The output of AND gate 128 is a pulse train which satisfies the timing interval within the correlation. The constraint is that the expected pulse interval fall in the range $(M+1) \times Cp$ to $(M+P) \times Cp$ where Cp equals the shift clock period. The output of AND gate 128 enters multiple N-input AND gate 132 and also passes along wire 131 to stage two of the device.

The input from wire 131 enters register 134 in stage 2, which is identical to register 124 and then passes into register 132 which is identical to register 122. Register 132 also has a signal from each cell going through a corresponding set of AND gates to OR gate 136 and then to AND gate 138. AND gate 138 has a second input which is the wire 131 input of the first stage. Thus, the output from AND gate 138 represents a three-pulse coincidence in time between any of the P cells of register 132, a signal passing from the first stage to the second state and a third signal in any of the P cells of register 122. The inverse order of the two P registers reduces the multiplicity of correlations which would otherwise be required. Note that in the second stage, AND gate 138 represents a coincidence between the first stage of synchronized unfiltered data and the second stage which operates only on the filtered output of the first stage, in contrast to the prior art. The output of AND gate 138 passes through OR gate 151 to N fold AND gate 132 and also to the next stage. The N'th stage of the device is illustrated at the bottom of the figure showing register 144, register 142, the corresponding set of AND gates, OR gate 146 and AND gate 148 all of which have the same function as their corresponding numbers in stage two. The output of AND gate 148 passes through OR gate 152 to N-fold AND gate 132. The output of N-fold AND gate 132 thus represents an N-fold correlation: a first stage correlation on the data followed by an N−1 correlation on the filtered output of the first stage.

The effective magnitude of N may be varied by controlling signals to OR gate 151 and 152. If the signal on line 153 or 154 is high, the output of the OR gate will always be high and that stage of the filter will be effectively removed. It is thus possible to change the filter from 1 to N stages at will. This change may be made manually be setting switches or be made automatically under control of processor 310. Controlling the correlations by changing the number P in the tolerance register from a first value to a lower value will be described below. The second type of parameter control is changing the repetition rate of the clock which is done in circuit 170 which is also described below.

The degree of filtering is controlled by the number of cells active in the P registers, that is, the number of discrete positions that are permitted to be acceptable conditions. Reducing the size of the P register increases the degree of filtering of the input data. If P were reduced to 1, then only one discrete period pattern will be passed, it being; $(M+1) \times Cp$ = minimum passable period. AND gates 161, 162, 164, 165, control the effective size of the P register, although other commercially available logic devices may be more hardware efficient. For example, the inventors have used a single TRW 1023J device which emulates the P register, the AND gates, and the summation OR gate functions. Application of the teaching of this disclosure to connect the 1023J is straightforward and is not set forth here, the figures herein being generally applicable. The embodiment illustrated in the figures could also readily be implemented by a custom or semicustom chip set, if the production run is long enough to justify the design cost.

A logic low on signal line 163 will effectively disable the first cell of stage 1 and the last cell of stage 2, . . . N by disabling AND gates 161 (the same number is used for corresponding gates in all stages) connected to OR gates 126, 136 and 146. It is important to note that increasing the degree of filtering reduces the effective size of the P register towards the M register. Similarly, the second cell of stage 1 and the next to the last cell of stages 2-N are disabled by a logic low on line 164, connected to AND gates 162. The process continues through AND gates 165-166 on the remaining stages.

Figure 3:
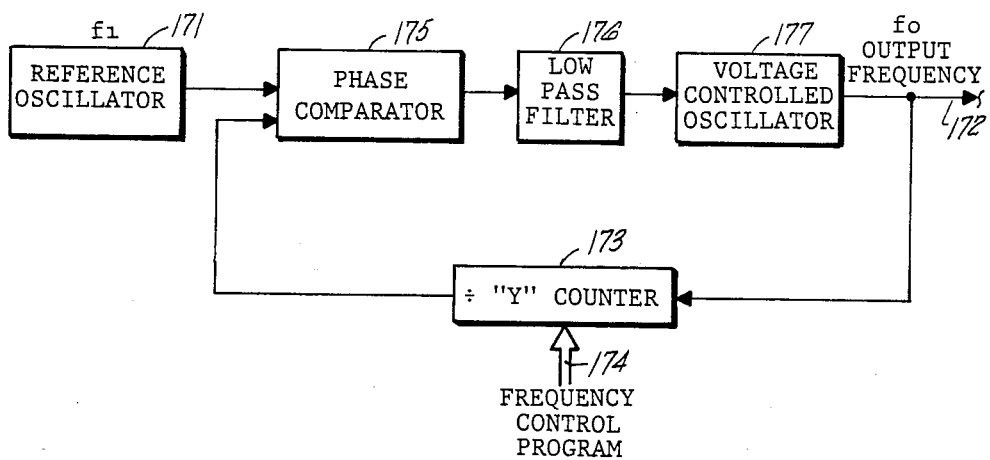
FIG. 3 illustrates schematically a circuit for varying a filtering clock frequency.

The clock control circuit 170 employs conventional digital frequency synthesizer techniques. The filter clock frequency is determined by the following equation;

$$\text{Clock Frequency} = \frac{\left(M + \frac{P}{2}\right)}{Ts} = \frac{1}{Cp}$$

where Ts is the mean period of the radar emitter being searched for. Processor 310 calculates this value and then programs the digitally programmable frequency synthesizer shown in FIG. 3. The output of this circuit, on signal line 172, is equal to the clock frequency desired. This circuit is programmed by signal lines 174 through the "Y" counter 173. The value of "Y" is determined by;

$$Y = \frac{fo}{f_{reference}}$$

where again fo equals the desired clock frequency. The reference oscillator, 171, would typically be a stable crystal controlled source. The remaining components, that is the phase comparator 175, the low pass filter 176, and the voltage controlled oscillator 177, are conventional components that comprise a typical phase locked loop configuration. In the process of designing a system incorporating this invention, fo will be in a range determined by the transmitters that will be encountered and the values of Y and f reference may be chosen as part of the system design. For example, if Y is greater than 100, the resolution on fo will be less than 1%, which should be ample.

The output pulse train of AND gate 132 represents the actual radar emitter signal recognized by the criteria. The time between output pulses represents the actual pulse period. Processor 310 measures this time and from its value calculates a second value of filter settings of P register size, clock period Cp, and new N value for stage control.

A straightforward method is to reduce P to P'+P=1. Other methods, such as sequentially dividing P by 2, may also be used. This processor then alters Cp in a manner to drive the pulse correlation between the output of register 124 and a reduced size P' register 122 by satisfying;

$$\left(M + \frac{P'}{2}\right) \times Cp' = \text{the mean time between output pulses,}$$

where P'/2 represents the variance or jitter of the output pulse train. To find a final value of P, one takes an average of A output pulse periods and obtains;

$$\frac{1}{A_o} \sum_{}^{A} T_{(n)} - T_{(n-1)} = Cp' \times \left(M + \frac{P'}{2}\right)$$

and $$P' = (Tn)_{max} - (Tn)_{min}$$

In these equations Cp' and P' are to be determined where the remaining parameters are known. The second equation recognizes that the transmitter fluctuates and P' must allow for fluctuations. Once a final value of P' is selected that provides a suitable margin for fluctuations (three standard deviations, say), a final N' value for the number of stages will be selected. The choice of this value is left to the system designer and forms no part of the invention. The implementation of the capability to vary N is part of the invention. If N' is small, there will be more false alarms that pass through. If N' is large, the discrimination will be improved, but a missing transmitter pulse will result in no output for N' radar pulse periods. The tradeoff to be made is part of the overall system design.

A simple numerical example will illustrate the capacity of the filter. If it is desired to search for a radar emitter having a pulse rate interval which is nominally 1 millisecond (ms) and is known to have a 10% uncertainty and if the value of M is 512 and the value of P is 64, then the tolerance of the first stage will be ±P/2M, i.e. ±64/1024 or 6¼%. If these values are substituted in the equation given above, then the value of the clock period Cp is 1 ms/(1/(M+P/2)) or 1/544 milliseconds. The degree of confidence will increase with the number of stages, of course. Once a signal passes through the apparatus indicating that the criterion is satisfied, then the value of P is divided by 2 and simple arithmetic indicates the corresponding value of the adjusted clock period in order to center the calculated average pulse rate interval within the P register. It is important that the tolerance be symmetric above and below the expected value so as not to introduce errors. Eventually, the value of P can be reduced to 2, which in this example requires a clock period of 1/513 ms corresponding to a tolerance of ±1/512% for the first stage (a realistic system will not be able to use this degree of precision). Conventional shift register hardware easily operates with clock periods one-tenth the value used in this example so that the range usually associated with radar pulses may easily be covered by changing the clock period and/or gating active additional cells of the M register.

The interval between radar pulses is not always uniform. Some radars employ "stagger" in which the pulse interval is sequentially two different periods, A and B. In this case, the clock period is adjusted to cover the pulse rate interval of A+B. The pattern then goes through unaltered and the tolerance may be tightened exactly as in the case of a simple pulse rate interval. One problem does arise in the particular case when there are two radars within range with the same pulse rate interval, but operating independently. In that case, both pulse trains will pass through the filter if they are within the tolerance. The processor 310 knows that the correct pulse rate interval has been found but cannot tell if the interval is a harmonic of the true one, i.e., whether it is a different radar with half the pulse rate interval or if there are two radars which are operating independently. In a simple test, you merely change the clock period by a factor of 2 and look to see if the signal still passes through. If it is a harmonic, the signal will still pass; if it is two independent emitters, the signal will not pass.

Those skilled in the art will be able to implement the invention in many ways, in the light of the disclosure. Alternative sequences of reducing the size of the variable-length shift register (the P register) have already been set forth. The final tolerance will be a tradeoff between discrimination and increased number of false alarms, as will the initial and final number of stages.

We claim:

1. An adaptive digital correlating filter system for analyzing a train of pulses comprising:

at least two stages of sequentially connected clock-controlled correlation devices for producing a stage output signal in response to the occurrence within said pulse train of a pair of pulses within a first tolerance range, in which a first stage correlation device comprises a first fixed-length shift register connected to a first multi-cell shift register, each cell of which multi-cell shift register produces a cell signal for correlation and an output signal to the next cell in said multi-cell shift register and means for generating a first stage output signal for signalling a coincidence between an N'th pulse at an end of said fixed-length shift register and a pulse in one of said cells of said multi-cell shift register; and a second stage correlation device is connected to at least one output of said first stage correlation device, which second stage correlation device comprises a second multi-cell shift register connected to a second fixed-length shift register, the order of connection being opposite for said first stage and second stage correlation devices; and means for generating a second stage output signal for signalling a two-fold correlation in said first and second stages;

characterized in that:

said first and second correlation devices include first and second means for length control connected to said first and second multi-cell shift registers for rendering inactive sequentially the cell signals of those cells furthest from said first and second fixed-length shift registers, whereby the effective length of said first and second stage correlation devices may be controlled;

said clock has a variable clock repetition rate set initially to a value corresponding to an expected signal in said train of pulses; and said filter system further includes processing means connected to said at least two stages of correlation devices and to said clock, which processing means adaptively controls said effective lengths of said at least two stages of correlation devices and said variable clock repetition rate to adjust a tolerance parameter of said correlation devices from a predetermined loose tolerance for signal acquisition to a second, tighter, operating tolerance for efficient signal discrimination.

2. A filter system according to claim 1, in which said processing means calculates a pulse repetition interval for an acquired signal that passes through said first and second stage correlation devices and then activates said means for length control to reduce the number of effective cell signals from said first and second multi-cell shift registers, thereby forming a new effective length for said first and second multi-cell shift registers; and in which said processing means further controls said variable clock repetition rate in a predetermined manner such that said calculated pulse repetition interval corresponds to the time required for a pulse to pass through said fixed-length shift register and through half of said new effective length of said multi-cell shift registers, whereby the tolerance in pulse repetition interval produced by said multi-cell shift registers is reduced to said second tighter tolerance.

3. A filter system according to claim 2, in which said at least two stages of correlation devices comprise a variable number of stages, said variable number being controlled by said processor from a first number, used before signal acquisition, to a second layer number, whereby the degree of discrimination against unwanted signals is increased after a desired signal is acquired.

4. A filter system according to claim 2, further comprising gate means connected before said first stage correlation device and being controlled by said processing means for blocking the passage of a known pulse signal contained in said train of pulses, whereby said first stage correlation device operates only on pulses other than siad known pulse signal.

* * * * *